(12) United States Patent
Kameyama et al.

(10) Patent No.: US 10,074,719 B2
(45) Date of Patent: Sep. 11, 2018

(54) SEMICONDUCTOR DEVICE IN WHICH AN INSULATED-GATE BIPOLAR TRANSISTOR (IGBT) REGION AND A DIODE REGION ARE FORMED ON ONE SEMICONDUCTOR SUBSTRATE

(71) Applicants: Satoru Kameyama, Toyota (JP); Keisuke Kimura, Nagakute (JP)

(72) Inventors: Satoru Kameyama, Toyota (JP); Keisuke Kimura, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/443,199

(22) PCT Filed: Dec. 20, 2012

(86) PCT No.: PCT/JP2012/083100
§ 371 (c)(1),
(2) Date: May 15, 2015

(87) PCT Pub. No.: WO2014/097454
PCT Pub. Date: Jun. 26, 2014

(65) Prior Publication Data
US 2015/0295042 A1 Oct. 15, 2015

(51) Int. Cl.
*H01L 29/06* (2006.01)
*H01L 29/861* (2006.01)
(Continued)

(52) U.S. Cl.
CPC ...... *H01L 29/0696* (2013.01); *H01L 27/0629* (2013.01); *H01L 29/0804* (2013.01);
(Continued)

(58) Field of Classification Search
CPC .................. H01L 27/10832; H01L 29/1095
See application file for complete search history.

(56) References Cited

U.S. PATENT DOCUMENTS

| 9,379,224 B2 * | 6/2016 | Soeno .................. H01L 29/407 |
| 2007/0215938 A1 * | 9/2007 | Yanagida ............ H01L 29/0653 257/330 |

(Continued)

FOREIGN PATENT DOCUMENTS

| JP | 2009-253004 A | 10/2009 |
| JP | 2010-171385 A | 8/2010 |

(Continued)

*Primary Examiner* — Lex Malsawma
*Assistant Examiner* — Geoffrey Ida
(74) *Attorney, Agent, or Firm* — Oliff PLC

(57) ABSTRACT

The present application discloses a semiconductor device in which an IGBT region and a diode region are formed on one semiconductor substrate. The IGBT region includes: a collector layer; an IGBT drift layer; a body layer; a gate electrode; and an emitter layer. The diode region includes: a cathode layer; a diode drift layer; an anode layer; a trench electrode; and an anode contact layer. The diode region is divided into unit diode regions by the gate electrode or the trench electrode. In a unit diode region adjacent to the IGBT region, when seen in a plan view of the front surface of the semiconductor substrate, the anode layer and the anode contact layer are mixedly placed, and the anode contact layer is placed at least in a location opposite to the emitter layer with the gate electrode interposed therebetween.

1 Claim, 7 Drawing Sheets

(51) Int. Cl.
*H01L 29/739* (2006.01)
*H01L 27/06* (2006.01)
*H01L 29/08* (2006.01)
*H01L 29/10* (2006.01)

(52) U.S. Cl.
CPC ...... *H01L 29/0821* (2013.01); *H01L 29/1095* (2013.01); *H01L 29/7397* (2013.01); *H01L 29/861* (2013.01)

(56) References Cited

U.S. PATENT DOCUMENTS

| | | | |
|---|---|---|---|
| 2009/0001411 A1* | 1/2009 | Tokura | H01L 27/0664 257/140 |
| 2010/0156506 A1* | 6/2010 | Tsuzuki | H01L 27/0664 327/478 |
| 2012/0025874 A1* | 2/2012 | Saikaku | H01L 29/1095 327/109 |
| 2012/0043581 A1 | 2/2012 | Koyama et al. | |
| 2012/0068248 A1 | 3/2012 | Kawaguchi | |
| 2014/0217465 A1 | 8/2014 | Soeno | |

FOREIGN PATENT DOCUMENTS

| | | |
|---|---|---|
| JP | 2011-243694 A | 12/2011 |
| JP | 2012-043890 A | 3/2012 |
| JP | 2012-064849 A | 3/2012 |
| WO | 2013/030943 A1 | 3/2013 |

* cited by examiner

SEMICONDUCTOR DEVICE IN WHICH AN INSULATED-GATE BIPOLAR TRANSISTOR ( IGBT) REGION AND A DIODE REGION ARE FORMED ON ONE SEMICONDUCTOR SUBSTRATE

TECHNICAL FIELD

A technology disclosed herein relates to semiconductor devices.

BACKGROUND ART

JP 2012-43890 A discloses a semiconductor device in which an IGBT region and a diode region are formed on one semiconductor substrate. The semiconductor device has a front surface electrode provided on a front surface of the semiconductor substrate and a back surface electrode provided on a back surface of the semiconductor substrate. The IGBT region includes: a collector layer of a first conductivity type, the collector layer being in contact with the back surface electrode; an IGBT drift layer of a second conductivity type, the IGBT drift layer being provided on a front surface side of the semiconductor substrate with respect to the collector layer; a body layer of the first conductivity type, the body layer being provided on the front surface side of the semiconductor substrate with respect to the IGBT drift layer, the body layer being in contact with the front surface electrode; a gate electrode placed within a trench extending from the front surface of the semiconductor substrate to the IGBT drift layer and insulated from the semiconductor substrate and the front surface electrode by an insulating film; and an emitter layer of the second conductivity type, the emitter layer being partially provided between the body layer and the front surface electrode, the emitter layer being in contact with the insulating film of the gate electrode and the front surface electrode. The diode region includes: a cathode layer of the second conductivity type, the cathode layer being in contact with the back surface electrode; a diode drift layer of the second conductivity type, the diode drift layer being provided on the front surface side of the semiconductor substrate with respect to the cathode layer, the diode drift layer being lower in impurity concentration than the cathode layer; an anode layer of the first conductivity type, the anode layer being provided on the front surface side of the semiconductor substrate with respect to the diode drift layer, the anode layer being in contact with the front surface electrode; a trench electrode placed within a trench extending from the front surface of the semiconductor substrate to the diode drift layer and insulated from the semiconductor substrate by an insulating film; and an anode contact layer of the first conductivity type, the anode contact layer being provided between the anode layer and the front surface electrode, the anode contact layer being higher in impurity concentration than the anode layer. The diode region is divided into unit diode regions by the gate electrode or the trench electrode.

SUMMARY OF INVENTION

Technical Problem

Formation of a wide anode contact layer in a diode region causes an amount of hole injection from the anode contact layer into a diode drift layer to be large, so that there is an increase in switching loss. For this reason, for a reduction in switching loss during diode operation, it is preferable that the proportion of the anode contact layer in the diode region be reduced. However, merely making a smaller anode contact layer results in a great fluctuation in forward voltage due to gate interference during diode operation.

Solution to Technical Problem

Disclosed herein is a semiconductor device in which an IGBT region and a diode region are formed on one semiconductor substrate. The semiconductor device has a front surface electrode provided on a front surface of the semiconductor substrate and a back surface electrode provided on a back surface of the semiconductor substrate. The IGBT region includes: a collector layer of a first conductivity type, the collector layer being in contact with the back surface electrode; an IGBT drift layer of a second conductivity type, the IGBT drift layer being provided on a front surface side of the semiconductor substrate with respect to the collector layer; a body layer of the first conductivity type, the body layer being provided on the front surface side of the semiconductor substrate with respect to the IGBT drift layer, the body layer being in contact with the front surface electrode; a gate electrode placed within a trench extending from the front surface of the semiconductor substrate to the IGBT drift layer and insulated from the semiconductor substrate and the front surface electrode by an insulating film; and an emitter layer of the second conductivity type, the emitter layer being partially provided between the body layer and the front surface electrode, the emitter layer being in contact with the insulating film of the gate electrode and the front surface electrode. The diode region includes: a cathode layer of the second conductivity type, the cathode layer being in contact with the back surface electrode; a diode drift layer of the second conductivity type, the diode drift layer being provided on the front surface side of the semiconductor substrate with respect to the cathode layer, the diode drift layer being lower in impurity concentration than the cathode layer; an anode layer of the first conductivity type, the anode layer being provided on the front surface side of the semiconductor substrate with respect to the diode drift layer, the anode layer being in contact with the front surface electrode; a trench electrode placed within a trench extending from the front surface of the semiconductor substrate to the diode drift layer and insulated from the semiconductor substrate by an insulating film; and an anode contact layer of the first conductivity type, the anode contact layer being partially provided between the anode layer and the front surface electrode, the anode contact layer being higher in impurity concentration than the anode layer. The diode region is divided into unit diode regions by the gate electrode or the trench electrode. In a unit diode region adjacent to the IGBT region, when seen in a plan view of the front surface of the semiconductor substrate, the anode layer and the anode contact layer are mixedly placed, and the anode contact layer is placed at least in a location opposite to the emitter layer with the gate electrode interposed therebetween.

The semiconductor device described above is configured such that in the unit diode region adjacent to the IGBT region, the anode contact layer is not wholly but partially formed. With such a configuration, an amount of injection of holes from the anode contact layer into the diode drift layer during diode operation is reduced. This makes it possible to improve the reverse recovery characteristics of the diode region and reduce a switching loss.

Further, the semiconductor device described above makes it possible to suppress the influence of gate interference during diode operation. That is, even in a case where during diode operation the application of a gate voltage to the gate electrode of the IGBT region causes a channel that connects the emitter layer and the IGBT drift layer to be formed near the gate electrode, a reduction in holes that is attributed to the formation of the channel can be suppressed, as in the unit diode region adjacent to the IGBT region the anode contact layer is formed in the location opposite to the emitter layer with the gate electrode interposed therebetween. This makes it possible to suppress a fluctuation in forward voltage due to gate interference during diode operation.

DESCRIPTION OF EMBODIMENTS

The semiconductor device disclosed herein can be configured such that in the unit diode region adjacent to the IGBT region, when seen in the plan view of the front surface of the semiconductor substrate, the anode contact layer and the anode lam are alternately placed with respect to a direction in which the gate electrode extends.

The semiconductor device described above makes it possible to, in the unit diode region adjacent to the IGBT region, allow the anode contact layer to remain in the location opposite to the emitter layer with the gate electrode interposed therebetween and, at the same time, makes it possible to reduce the proportion of the anode contact layer in the unit diode region.

The semiconductor device disclosed herein can be configured such that in the unit diode region adjacent to the IGBT region, when seen in the plan view of the front surface of the semiconductor substrate, the anode contact layer is placed near the gate electrode with respect to a direction orthogonal to the direction in which the gate electrode extends, and the anode layer is placed in a middle of the unit diode region with respect to the orthogonal direction.

The semiconductor device described above makes it possible to, in the unit diode region adjacent to the IGBT region, allow the anode contact layer to remain in the location opposite to the emitter layer with the gate electrode interposed therebetween and, at the same time, makes it possible to reduce the proportion of the anode contact layer in the unit diode region.

Embodiments

Figure 1:
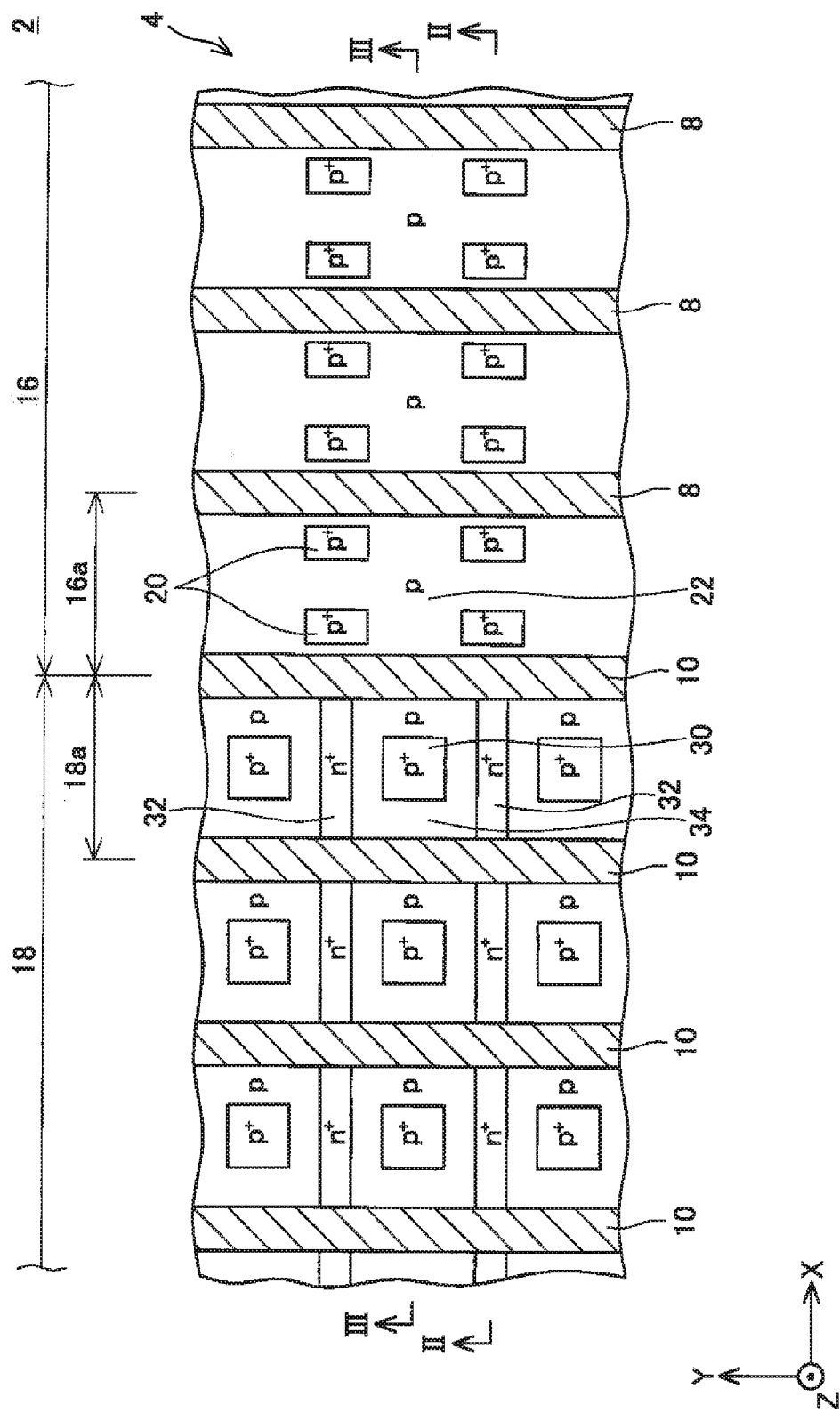
FIG. 1 is a plan view of a semiconductor device according to Embodiment 1.
Figure 2:
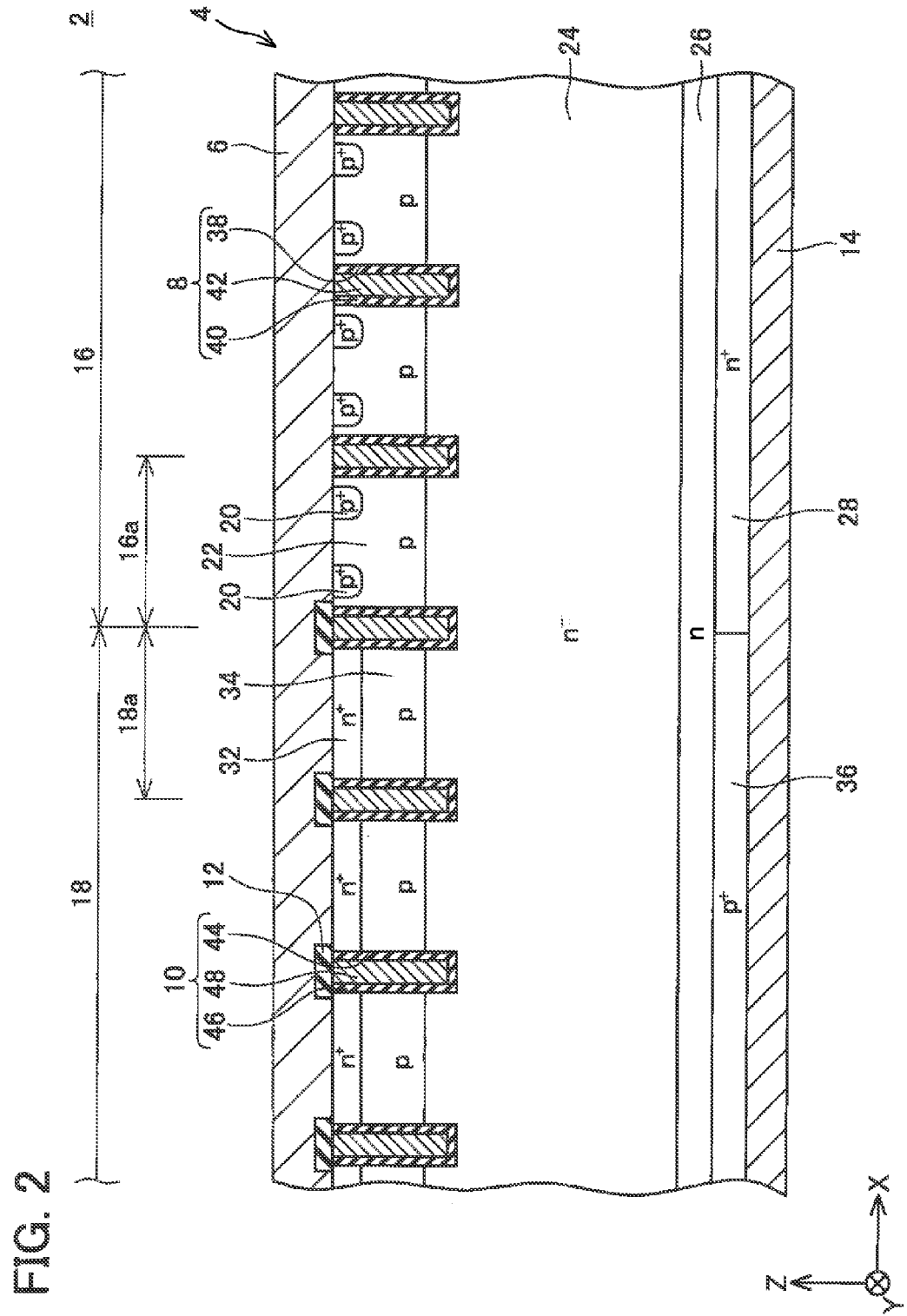
FIG. 2 is a cross-sectional view taken along the line II-II of FIG. 1.
Figure 3:
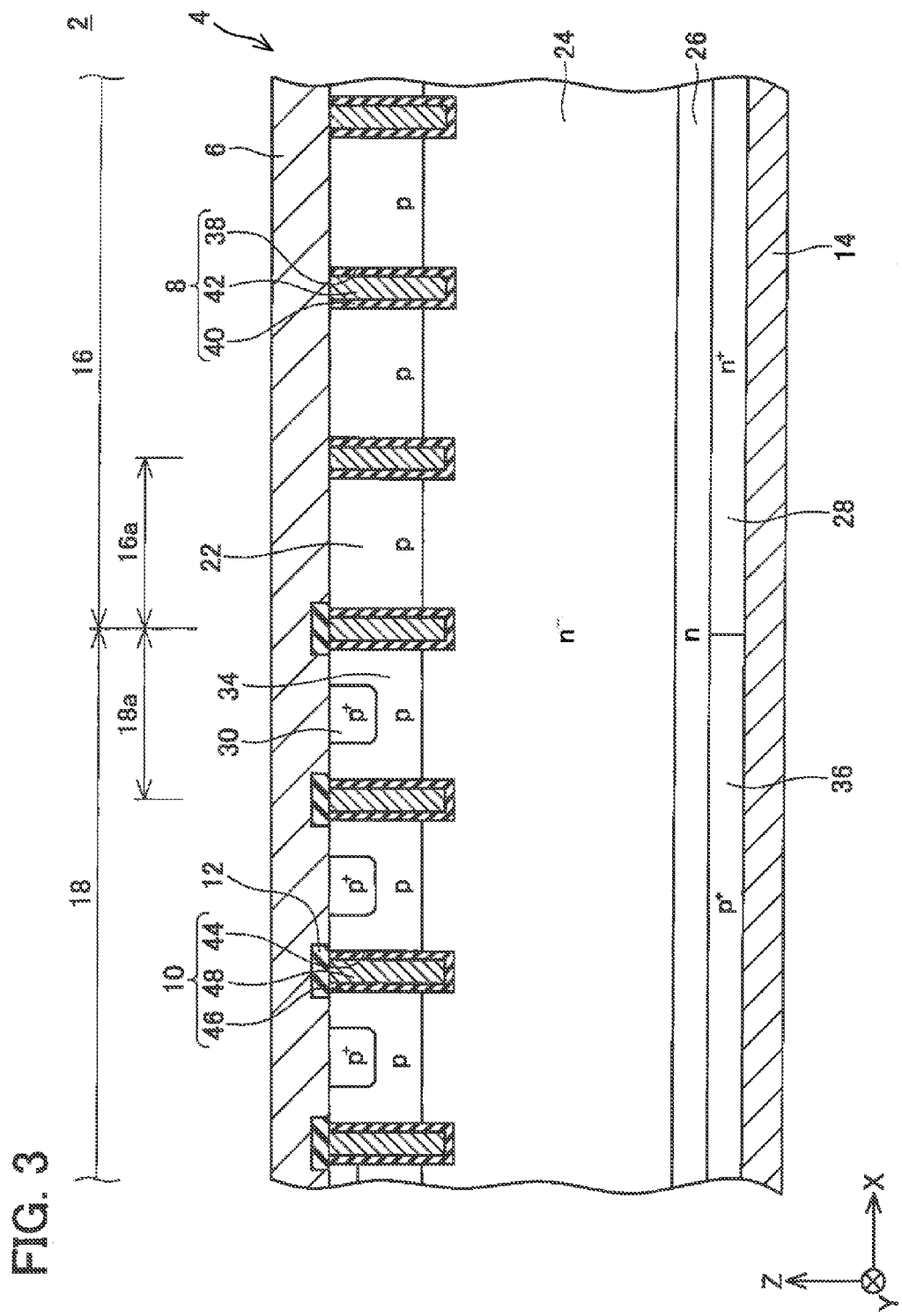
FIG. 3 is a cross-sectional view taken along the line III-III of FIG. 1.

A semiconductor device 2 shown in FIGS. 1 to 3 is an RC-IGBT in which an IGBT and a diode are formed on one semiconductor substrate 4. It should be noted that the plan view shown in FIG. 1 omits to illustrate a front surface electrode 6 formed on a front surface of the semiconductor substrate 4, and illustrates the front surface of the semiconductor substrate 4. Further, the semiconductor device 2 has a plurality of IGBT regions and a plurality of diode regions alternately placed, and has a plurality of boundaries between the IGBT regions and the diode regions. FIGS. 1 to 3 illustrate one of the plurality of boundaries between the IGBT regions and the diode regions, and each of the plurality of boundaries of the semiconductor device 2 has the same configuration as that illustrated in FIGS. 1 to 3.

The semiconductor device 2 includes the semiconductor substrate 4, a dummy gate 8, an insulating gate 10, a front surface insulating film 12, the front surface electrode 6, and a back surface electrode 14. The dummy gate 8, the insulating gate 10, and the front surface insulating film 12 are formed on a front surface side of the semiconductor substrate 4. The front surface electrode 6 is in contact with the front surface of the semiconductor substrate 4. The back surface electrode 14 is in contact with a back surface of the semiconductor substrate 4. The dummy gate 8 and the insulating gate 10 are formed at substantially regular intervals in the semiconductor substrate 4. The semiconductor substrate 4 includes a diode region 16 and an IGBT region 18.

As shown in FIGS. 2 and 3, the diode region 16 has formed therein an anode contact layer 20 made of a p-type semiconductor having a high impurity concentration, an anode layer 22 made of a p-type semiconductor, a drift layer 24 made of an n-type semiconductor having a low impurity concentration, a buffer layer 26 made of an n-type semiconductor, and a cathode layer 28 made of an n-type semiconductor having a high impurity concentration. The anode contact layer 20 and the anode layer 22 are exposed on the front surface of the semiconductor substrate 4, and are in contact with the front surface electrode 6. The anode contact layer 20 is partially formed in a surface part of the anode layer 22. The drift layer 24 is formed on a back surface of the anode layer 22. The buffer layer 26 is fomied on a back surface of the drift layer 24. The cathode layer 28 is formed on a back surface of the buffer layer 26. The cathode layer 28 is exposed on the back surface of the semiconductor substrate 4, and is in contact with the back surface electrode 14.

The IGBT region 18 has formed therein a body contact layer 30 made of a p-type semiconductor having a high impurity concentration, an emitter layer 32 made of an n-type semiconductor having a high impurity concentration, a body layer 34 made of a p-type semiconductor, a drift layer 24 made of an n-type semiconductor having a low impurity concentration, a buffer layer 26 made of an n-type semiconductor, and a collector layer 32 made of a p-type semiconductor having a high impurity concentration. The body contact layer 30, the emitter layer 32, and the body layer 34 are exposed on the front surface of the semiconductor substrate 4, and are in contact with the front surface electrode 6. The body contact layer 30 and the emitter layer 32 are partially formed in a surface part of the body layer 34. The drift layer 24 is formed on a back surface of the body layer 34. The buffer layer 26 is formed on a back surface of the drift layer 24. The collector layer 36 is formed on a back surface of the buffer layer 26. The collector layer 36 is exposed on the back surface of the semiconductor substrate 4, and is contact with the back surface electrode 14.

In the semiconductor device 2, the drift layer 24 (also referred to as "diode drift layer") of the diode region 16 and the drift layer 24 (also referred to as "IGBT drift layer") of the IGBT region 18 are formed as a common layer. In the semiconductor device 2, the buffer layer 26 of the diode region 16 and the buffer layer 26 of the IGBT region 18 are formed as a common layer. Further, in the semiconductor device 2, the anode layer 22 of the diode region 16 and the body layer 34 of the IGBT region 18 are formed as a common layer. In other words, the anode layer 22 of the diode region 16 and the body layer 34 of the IGBT region 18 are at the same depth from the front surface of the semiconductor substrate 4, and have the same impurity concentration.

In the diode region 16, the dummy gate 8 passes through the anode layer 22 from the front surface side of the semiconductor substrate 4 and reaches into the drift layer 24. The dummy gate 8 includes a dummy gate insulating film 40 and a dummy gate electrode 42. The dummy gate insulating film 40 is formed on an inner side of a trench 38 formed on the front surface side of the semiconductor substrate 4. The dummy gate electrode 42 is covered with the dummy gate insulating film 40, and fills the trench 38. The dummy gate electrode 42 is in contact with the front surface electrode 6, and is electrically connected to the front surface electrode 6.

In the IGBT region 18, the insulating gate 10 passes through the body layer 34 from the front surface side of the semiconductor substrate 4 and reaches into the drift layer 24. The insulating gate 10 includes a gate insulating film 46 and a gate electrode 48. The gate insulating film 46 formed on an inner wall of a trench 44 formed on the front surface side of the semiconductor substrate 4. The gate electrode 48 is covered with the gate insulating film 46, and fills the trench 44. The gate electrode 48 is isolated from the front surface electrode 6 by the front surface insulating film 12. The gate electrode 48 is electrically connected to a gate electrode terminal (not illustrated).

The diode region 16 is constituted by a plurality of unit diode regions divided from each other by the trench 38 of the dummy gate 8 or the trench 44 of the insulating gate 10. The IGBT region 18 is constituted by a plurality of unit IGBT regions divided from each other by the trench 44 of the insulating gate 10. In the following, a unit diode region adjacent to the IGBT region 18 is particularly denoted as "unit diode region 16a," and a unit IGBT region adjacent to the unit diode region 16a is particularly denoted as "unit IGBT region 18a."

The following describes features of placement as seen in a top view of the semiconductor substrate 4 as shown in FIG. 1. In the IGBT region 18, the emitter layer 32 is placed between two insulating gates 10 placed side by side, and extends from one of the insulating gates 10 to the other of the insulating gates 10 in a direction (i.e. a direction along the x-axis of the drawing) orthogonal to a direction (i.e. a direction along the y-axis of the drawing) in which the insulating electrodes 10 extend. When seen, in the top view of the semiconductor substrate 4, the body layer 34 is divided into rectangular regions by the gate electrodes 10 and the emitter layer 32, and the body contact layer 30 is placed near the center of each of the rectangular regions into which the body layer 34 has been divided. In the diode region 16, the anode contact layer 20 is placed only in a region proximate to an insulating gate 10 or a dummy gate 8. The anode contact layer 20 is placed only on an extension of a direction in which the emitter layer 32 extends in the IGBT region 18. That is, in the unit diode region 16a adjacent to the IGBT region 18, the anode contact layer 20 is placed in a position opposite to the emitter layer 32 of the unit IGBT region 18a adjacent to the unit diode region 16a, with the insulating gate 10 interposed therebetween. The present embodiment is configured such that in the unit diode region 16a adjacent to the unit IGBT region 18a, the anode contact layer 20 and the anode layer 22 are alternately placed near the insulating gate 10 with respect to the direction (i.e. the direction along the y-axis of the drawing) in which the insulating electrode 10 extends. Further, the present embodiment is configured such that in the unit diode region 16a adjacent to the unit IGBT region 18a, the anode contact layer 20 is placed near the insulating gate 10 with respect to the direction (i.e. the direction along the x-axis of the drawing) orthogonal to the direction in which the insulating electrode 10 extends, and the anode layer 22 is placed in the middle of the unit diode region 16a with respect to the orthogonal direction.

Assuming that the anode contact layer 20 is a part of the anode layer 22, in the unit diode region 16a adjacent to the unit IGBT region 18a, an impurity concentration of the anode layer 22 in a location opposite to the emitter layer 32 with the insulating gate 10 interposed therebetween is higher than an average impurity concentration of the anode layer 22 in the unit diode region 16a. Alternatively, with respect to the direction (along the y-axis) in which the insulating electrode 10 extends, an impurity concentration of the anode layer 22 in the unit diode region 16a adjacent to the unit IGBT region 18a takes a maximum value in the location opposite to the emitter layer 32 with the insulating gate 10 interposed therebetween.

The semiconductor device 2 of the present embodiment is configured such that in the unit diode region 16a adjacent to the unit IGBT region 18a, the anode contact layer 20 is formed in the location opposite to the emitter layer 32 with the insulating gate 10 interposed therebetween. Such a configuration makes it possible to prevent holes accumulated in the drift layer 24 of the unit diode region 16a from intensively flowing into the body contact layer 30 of the unit IGBT region 18a when the semiconductor device 2 is in IGBT operation and the IGBT region 18 changes from being on to being off. Since a hole current into the body contact layer 30 at the time when the unit IGBT region 18a is turned off is suppressed, a latch-up phenomenon attributed to the emitter layer 32 is suppressed, so that RBSOA resistance of the semiconductor device be improved.

Further, the semiconductor device 2 of the present embodiment makes it possible to suppress the influence of gate interference during diode operation. That is, even in a case where during diode operation the application of a gate voltage to the gate electrode 48 of the unit IGBT region 18a causes a channel that connects the emitter layer 32 and the drift layer 24 to be formed near the insulating gate 10, a reduction in holes that is attributed to the formation of the channel can be suppressed, as the anode contact layer 20 is formed in a position in the unit diode region 16 that is opposite to the emitter layer 32 with the insulating gate 10 interposed therebetween. This makes it possible to suppress a fluctuation in forward voltage due to gate interference during diode operation.

The semiconductor device 2 of the present embodiment is configured such that in the unit diode region 16a adjacent to the unit IGBT region 18a, the anode contact layer 20 is not wholly but partially formed. With such a configuration, an amount of injection of holes from the anode contact layer 20 into the drift layer 24 during diode operation is reduced. This makes it possible to improve the reverse recovery characteristics of the diode region 16 and reduce a switching loss.

(Modifications)

Figure 4:
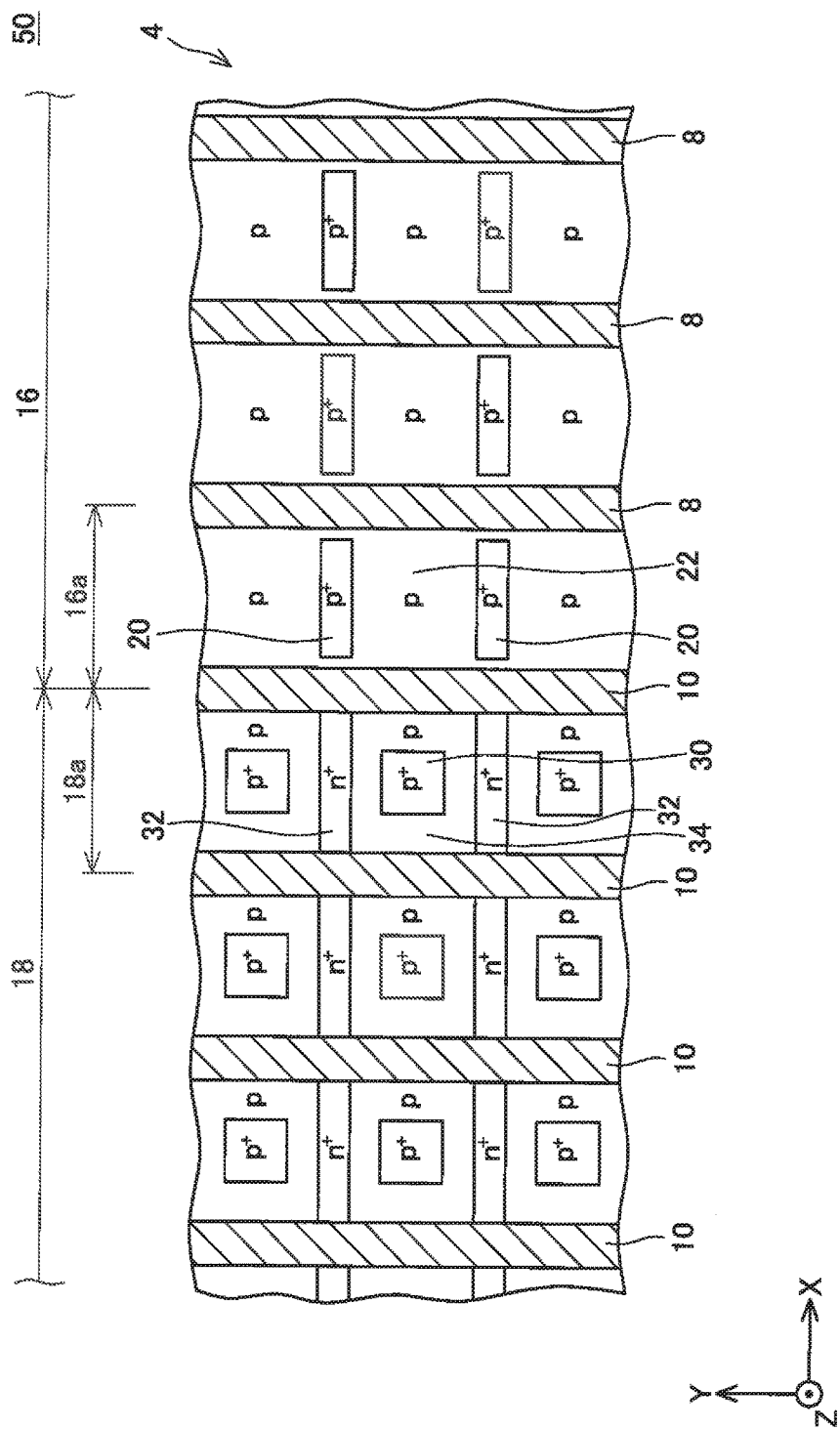
FIG. 4 is a plan view of a semiconductor device according to a modification.

The placement of the anode contact layer 20 in the diode region 16 is not limited to that of the embodiment described above. For example, as in the case of a semiconductor device 50 of a modification shown in FIG. 4, the anode contact layer 20 may be placed in such a manner as to extend in a direction (i.e. a direction along the x-axis of the drawing) orthogonal to a direction (i.e. a direction along the y-axis of the drawing) in which the insulating gate 10 or the dummy gate 8 extends. The modification shown in FIG. 4 is configured such that the anode contact layer 20 is placed only on an extension of a direction in which the emitter layer 32 extends in the IGBT region 18. The modification shown in FIG. 4 is configured such that in the unit diode region 16a adjacent to the unit diode region 18a, the anode contact layer 20 and the anode layer 22 are alternately placed with respect to the direction (i.e. the direction along the y-axis of the drawing) in which the insulating gate 10 extends.

Figure 5:
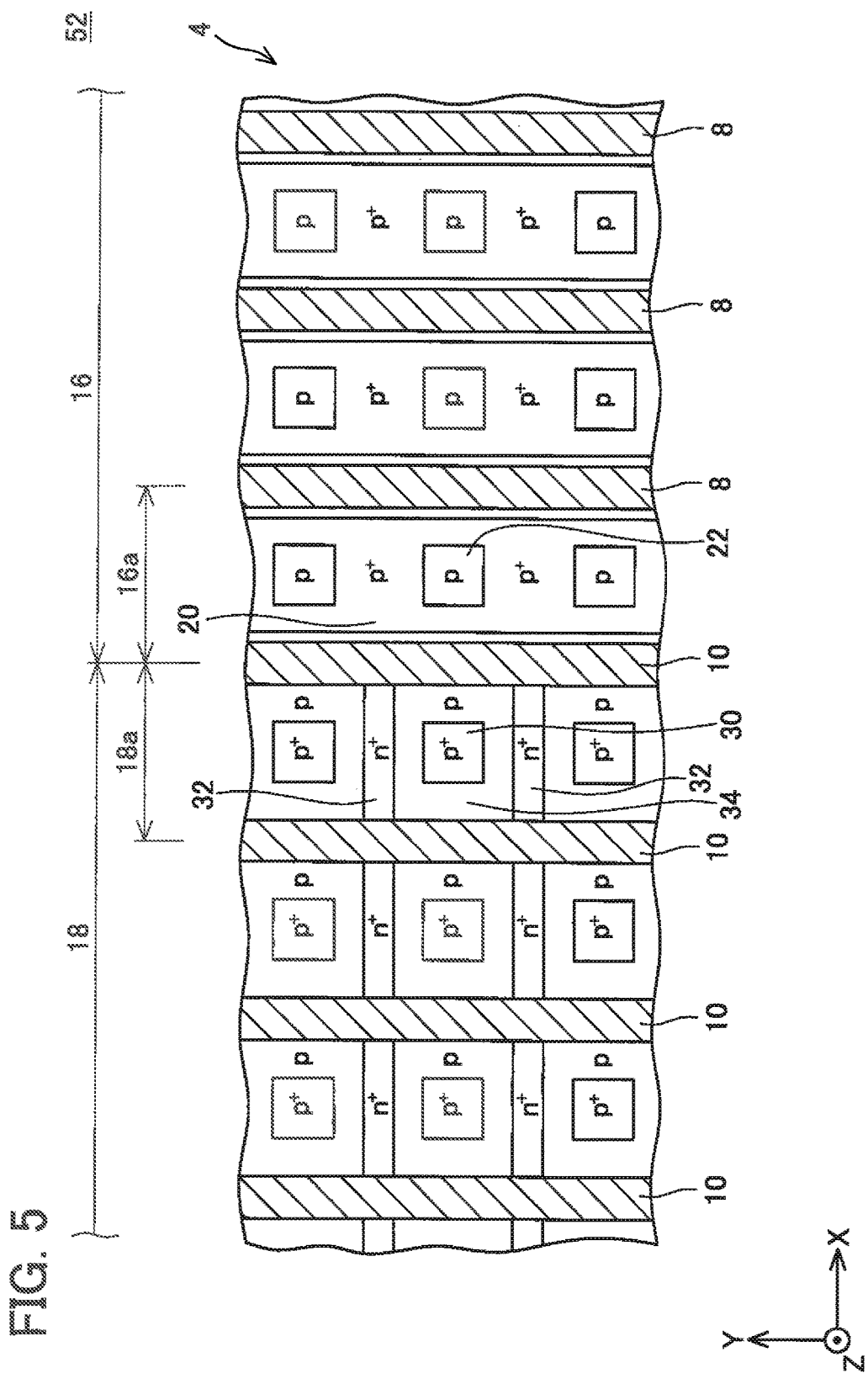
FIG. 5 is a plan view of a semiconductor device according to a modification.

Alternatively, as in the case of a semiconductor device 52 of a modification shown in FIG. 5, the anode contact layer 20 may be formed in the shape of a ladder having partial openings. The modification shown in FIG. 5 is configured such that in the unit diode region 16a adjacent to the unit IGBT region 18a, the anode contact layer 20 and the anode layer 22 are alternately placed in the middle of the unit diode region 16a with respect to a direction (i.e. a direction along the y-axis of the drawing) in which the insulating gate 10 extends. Further, the modification shown in FIG. 5 is configured such that in the unit diode region 16a adjacent to the unit IGBT region 18a, the anode contact layer 20 is placed near the insulating gate 10 with respect to a direction (i.e. a direction along the x-axis of the drawing) orthogonal to the direction in which the insulating gate 10 extends, and the anode layer 22 is placed in the middle of the unit diode region 16a with respect to the orthogonal direction.

Figure 6:
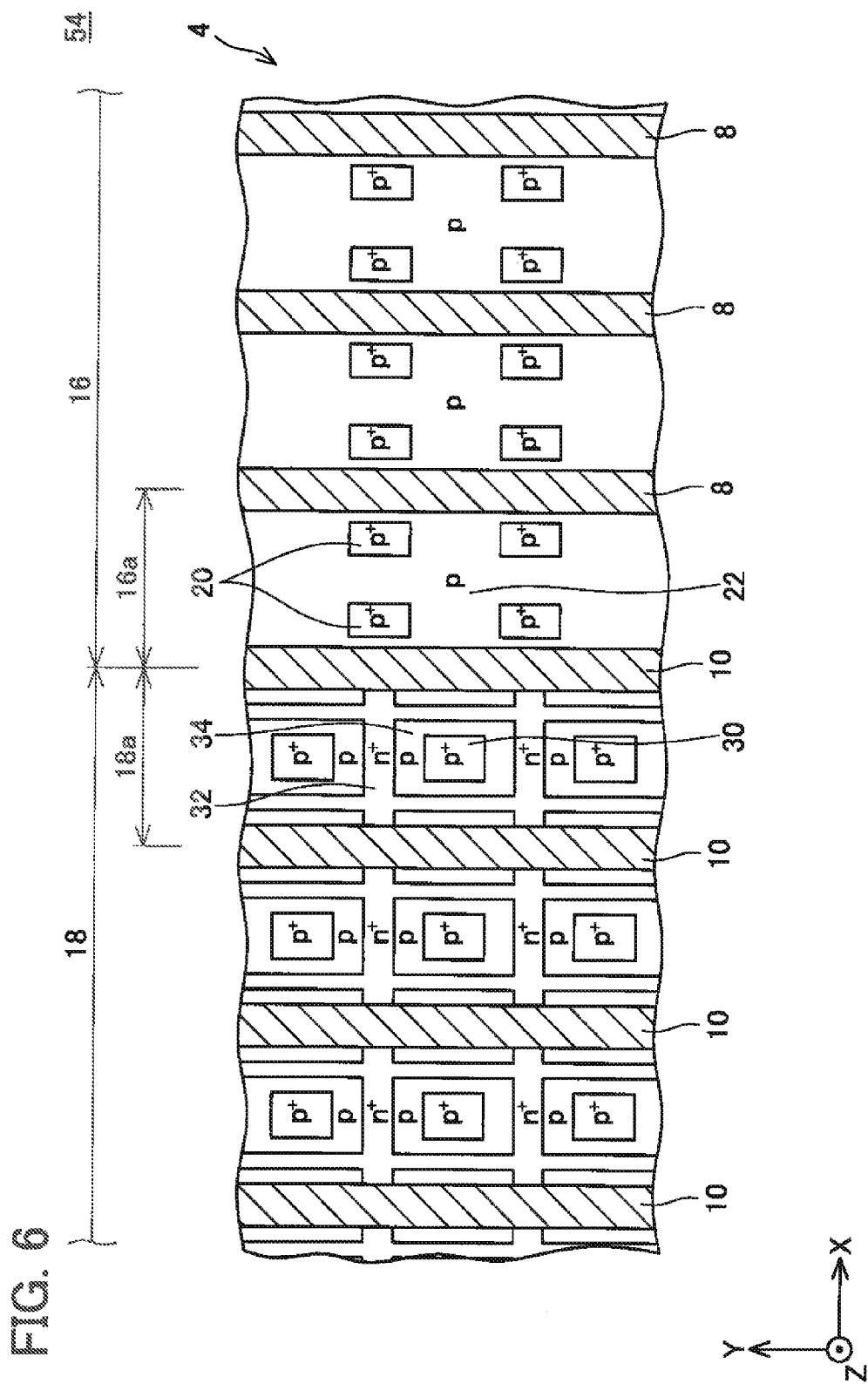
FIG. 6 is a plan view of a semiconductor device according to a modification.
Figure 7:
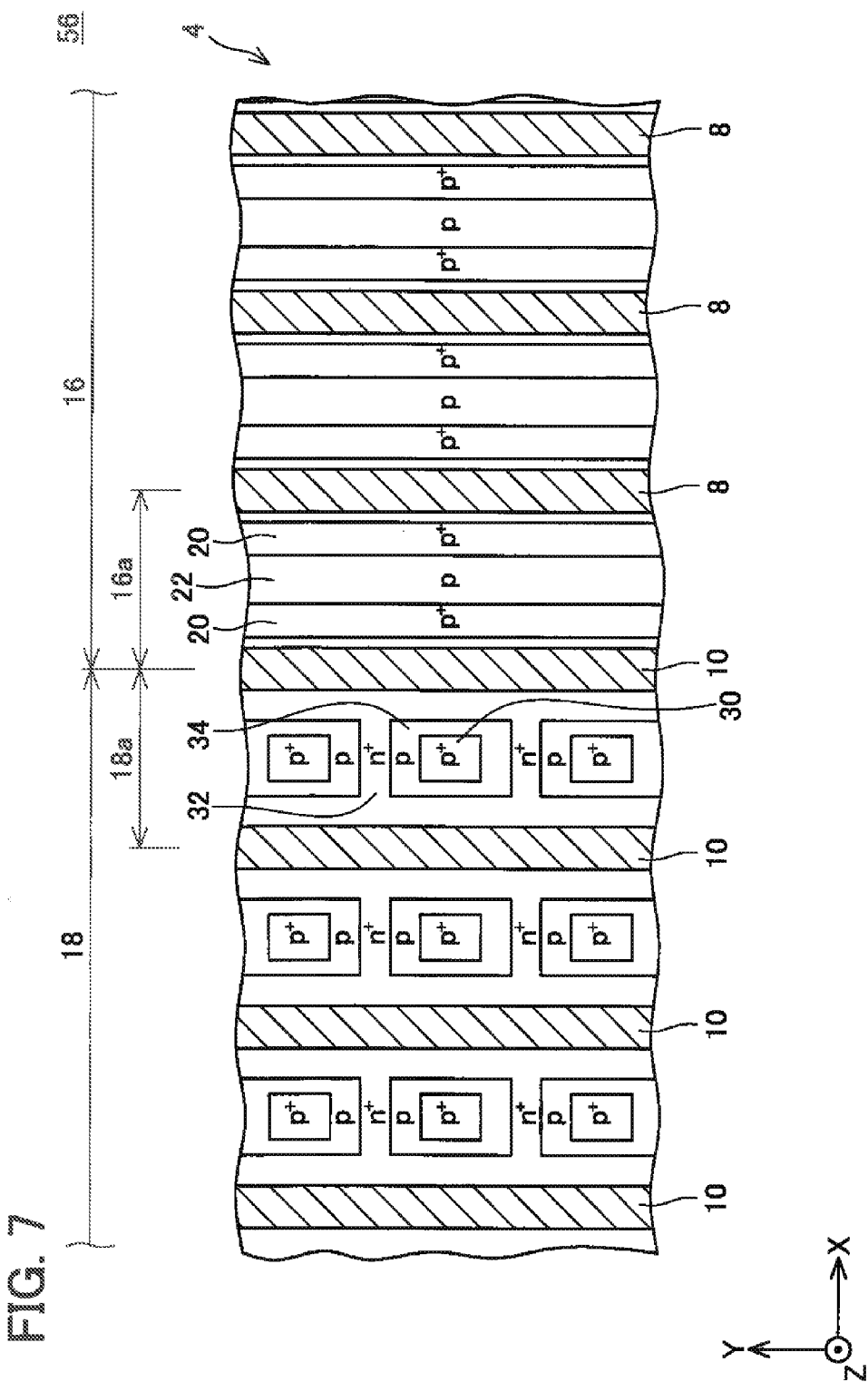
FIG. 7 is a plan view of a semiconductor device according to a modification.

The placement of the emitter layer 32 in the IGBT region 18 is not limited to that of the embodiment described above. For example, as in the case of a semiconductor device 54 of a modification shown in FIG. 6, the emitter layer 32 may be placed in the shape of a grid. Alternatively, as in the case of a semiconductor device 56 of a modification shown in FIG. 7, the emitter layer 32 may be placed in the shape of a ladder having partial openings. The modification shown in FIG. 6 is configured such that the anode contact layer 20 of the diode region 16 is placed in a location opposite to the emitter layer with the insulating gate 10 interposed therebetween. The modification shown in FIG. 7 is configured such that the anode contact layer 20 of the diode region 16 is placed in a location proximate to the insulating gate 10 or the dummy gate 8 in such a manner as to extend parallel to a direction (along the y-axis) in which the insulating gate 10 or the dummy gate 8 extends.

The representative and non-limiting specific embodiments of the present invention are described above in detail with reference to the drawings. The detailed description provided above is simply intended to provide those skilled in the art with the detail for implementing preferred examples of the present invention and is not intended to limit the scope of the present invention. Additional characteristics and inventions disclosed herein can be used independently of, or along with, other characteristics and inventions in order to provide a further improved semiconductor device.

The combinations of the characteristics and steps disclosed in the detailed description above are not essential for implementing the present invention in the broadest sense and are merely provided in order to explain particularly the representative specific embodiments of the present invention. In addition, various characteristics of the representative specific embodiments described above and various characteristics described in the independent and dependent claims do not have to be combined in accordance with the embodiments described herein or in any particular order when providing additional and useful embodiments of the present invention.

All the characteristics described in the present description and/or the claims are intended to be disclosed separately and independently from each other for the purpose of original disclosure, as well as for the purpose of restricting the claimed subject matters independent of the compositions of the characteristics described in the embodiments and/or the claims. In addition, all value ranges or indications of groups of entities are intended to disclose every possible intermediate value or intermediate entity for the purpose of original disclosure, as well as for the purpose of restricting the claimed subject matters.

The embodiments of the present invention are described above in detail. However, these embodiments are merely illustrative and are not intended to limit the scope of patent claims. The technology described in the scope of patent claims includes various changes and modifications of the specific embodiments illustrated above. The technical elements exemplified in the present description or the drawings exert technical utility independently or in various combinations, and are not limited to the combinations of the claims described in the application originally filed. Further, the technology exemplified in the present description or the drawings simultaneously achieve a plurality of objects, and achieving one of the objects itself has technical utility.

The invention claimed is:
1. A semiconductor device in which an Insulated-Gate Bipolar Transistor (IGBT) region and a diode region are formed on one semiconductor substrate, the semiconductor device comprising:
  a front surface electrode provided on a front surface of the semiconductor substrate; and
  a back surface electrode provided on a back surface of the semiconductor substrate,
  the IGBT region comprising:
    a collector layer of a first conductivity type, the collector layer being in contact with the back surface electrode;
    an IGBT drift layer of a second conductivity type, the IGBT drift layer being provided on a front surface side of the semiconductor substrate with respect to the collector layer;
    a body layer of the first conductivity type, the body layer being provided on the front surface side of the semiconductor substrate with respect to the IGBT drift layer, the body layer being in contact with the front surface electrode;
    gate electrodes, each being placed within a trench extending from the front surface of the semiconductor substrate to the IGBT drift layer and insulated from the semiconductor substrate and the front surface electrode by an insulating film; and
    an emitter layer of the second conductivity type, the emitter layer being partially provided between the body layer and the front surface electrode, the emitter layer being in contact with the insulating film of a gate electrode and the front surface electrode,
  the diode region comprising:
    a cathode layer of the second conductivity type, the cathode layer being in contact with the back surface electrode;
    a diode drift layer of the second conductivity type, the diode drift layer being provided on the front surface side of the semiconductor substrate with respect to the cathode layer, the diode drift layer being lower in impurity concentration than the cathode layer;

an anode layer of the first conductivity type, the anode layer being provided on the front surface side of the semiconductor substrate with respect to the diode drift layer, the anode layer being in contact with the front surface electrode;

trench electrodes, each being placed within a trench extending from the front surface of the semiconductor substrate to the diode drift layer and insulated from the semiconductor substrate by an insulating film; and a plurality of anode contact layers of the first conductivity type, the plurality of anode contact layers being partially provided between the anode layer and the front surface electrode, the plurality of anode contact layers being higher in impurity concentration than the anode layer, the IGBT region being divided into unit IGBT regions by the gate electrodes adjacent to each other, in a unit IGBT region adjacent to the diode region, when seen in a plan view of the front surface of the semiconductor substrate, the emitter layer being placed between two insulated gate electrodes, and a plurality of portions of the emitter layer spans the entire area between one of the insulated gate electrodes and the other of the insulated gate electrodes so that the body layer is divided into rectangular regions by at least the plurality of portions of the emitter layer, the diode region being divided into unit diode regions by the gate electrode and a trench electrode adjacent to the gate electrode, or by the trench electrodes adjacent to each other, and in a unit diode region adjacent to the IGBT region, when seen in a plan view of the front surface of the semiconductor substrate, (i) the anode layer and the plurality of anode contact layers being mixedly placed, (ii) the plurality of anode contact layers being placed at least in locations opposite to the plurality of portions of the emitter layer with the gate electrode interposed therebetween, (iii) the plurality of anode contact layers being placed near the gate electrode with respect to a direction orthogonal to a longitudinal direction of the gate electrode, (iv) the anode layer being placed in a middle of the unit diode region with respect to the direction orthogonal to the longitudinal direction of the gate electrode, (v) the plurality of anode contact layers being placed at intervals along the longitudinal direction of the gate electrode, and (vi) the plurality of anode contact layers and the anode layer being alternately placed along the longitudinal direction of the gate electrode.

* * * * *